United States Patent
Song

(10) Patent No.: US 12,507,418 B2
(45) Date of Patent: Dec. 23, 2025

(54) SEMICONDUCTOR DEVICE AND METHOD FOR FABRICATING THE SAME

(71) Applicant: SK hynix Inc., Icheon-si (KR)

(72) Inventor: Jeong Hwan Song, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 501 days.

(21) Appl. No.: 17/903,943

(22) Filed: Sep. 6, 2022

(65) Prior Publication Data

US 2023/0135287 A1     May 4, 2023

(30) Foreign Application Priority Data

Oct. 28, 2021 (KR) .................. 10-2021-0145463

(51) Int. Cl.
| | |
|---|---|
| *H10B 61/00* | (2023.01) |
| *H10B 63/00* | (2023.01) |
| *H10N 70/00* | (2023.01) |
| *H10N 70/20* | (2023.01) |

(52) U.S. Cl.
CPC ............. *H10B 61/10* (2023.02); *H10B 63/20* (2023.02); *H10N 70/028* (2023.02); *H10N 70/25* (2023.02); *H10N 70/826* (2023.02); *H10N 70/883* (2023.02); *H10N 70/8833* (2023.02)

(58) Field of Classification Search
CPC ........ H10B 61/10; H10B 63/20; H10B 63/22; H10B 63/80; H10B 63/82; H10B 63/845; H10B 61/00; H10B 63/84; H10N 70/028; H10N 70/25; H10N 70/826; H10N 70/883; H10N 70/8833; H10N 50/10; G06F 3/0656; G06F 12/08
See application file for complete search history.

(56) References Cited

U.S. PATENT DOCUMENTS

| | | |
|---|---|---|
| 9,177,916 B1 | 11/2015 | Barabash et al. |
| 9,425,237 B2 | 8/2016 | Jo |
| 9,960,350 B2 | 5/2018 | Ha |
| 10,910,552 B2 | 2/2021 | Lee et al. |
| 11,430,951 B2 * | 8/2022 | Jiang .................... H10N 70/826 |
| 2016/0308127 A1 | 10/2016 | Kim et al. |

(Continued)

FOREIGN PATENT DOCUMENTS

| | | |
|---|---|---|
| CN | 102034759 A | 4/2011 |
| CN | 110036479 A | 7/2019 |

(Continued)

OTHER PUBLICATIONS

Christophe Lacuyer; David C. Brock; Jay Last, "Appendix," in Makers of the Microchip: A Documentary History of Fairchild Semiconductor, MIT Press, 2010 (Year: 2010).

(Continued)

*Primary Examiner* — David Vu
(74) *Attorney, Agent, or Firm* — Perkins Coie LLP

(57) ABSTRACT

A semiconductor device may include: a first conductive line; a second conductive line disposed over the first conductive line to be spaced apart from the first conductive line; a variable resistance layer disposed over the first conductive line and below the second conductive line; at least one of a first dielectric layer or a second dielectric layer; at least one of a first contact or a second contact; and at least one of a first doped selector layer or a second doped selector layer.

19 Claims, 11 Drawing Sheets

(56) References Cited

U.S. PATENT DOCUMENTS

| | | |
|---|---|---|
| 2017/0053965 A1 | 2/2017 | Baek et al. |
| 2017/0092851 A1 | 3/2017 | Han et al. |
| 2019/0051700 A1 | 2/2019 | Kim |
| 2019/0214554 A1 | 7/2019 | Li et al. |
| 2020/0006428 A1 | 1/2020 | Jiang et al. |
| 2020/0006643 A1 | 1/2020 | Gosavi et al. |
| 2020/0161372 A1 | 5/2020 | Beckmann et al. |
| 2021/0183945 A1 | 6/2021 | Song |
| 2023/0131200 A1 | 4/2023 | Ha |

FOREIGN PATENT DOCUMENTS

| | | |
|---|---|---|
| CN | 112993155 A | 6/2021 |
| KR | 102030341 B1 | 10/2019 |

OTHER PUBLICATIONS

First Office Action for CN Appl. No. 202211259659.X, mailed on Aug. 16, 2025, 11 pages with English translation.

\* cited by examiner

SEMICONDUCTOR DEVICE AND METHOD FOR FABRICATING THE SAME

CROSS-REFERENCE TO RELATED APPLICATION

This patent document claims the priority and benefits of Korean Patent Application No. 10-2021-0145463 filed on Oct. 28, 2021, which is incorporated herein by reference in its entirety.

TECHNICAL FIELD

This patent document relates to memory circuits or devices and their applications in electronic devices or systems.

BACKGROUND

The recent trend toward miniaturization, low power consumption, high performance, and multi-functionality in the electrical and electronics industry has compelled the semiconductor manufacturers to focus on high-performance, high capacity semiconductor devices. Examples of such high-performance, high capacity semiconductor devices include memory devices that can store data by switching between different resistance states according to an applied voltage or current. The semiconductor devices may include an RRAM (resistive random access memory), a PRAM (phase change random access memory), an FRAM (ferroelectric random access memory), an MRAM (magnetic random access memory), and an electronic fuse (E-fuse).

SUMMARY

The disclosed technology in this patent document includes memory circuits or devices and their applications in electronic devices or systems and various implementations of an electronic device, in which an electronic device includes a semiconductor device which can improve a hard mask margin during a patterning process and prevent etch damage during patterning a selector layer.

In one aspect, a semiconductor device may include: a first conductive line; a second conductive line disposed over the first conductive line to be spaced apart from the first conductive line; a variable resistance layer disposed over the first conductive line and below the second conductive line; at least one of a first dielectric layer or a second dielectric layer, the first dielectric layer includes a first through-hole disposed between the first conductive line and the variable resistance layer and the second dielectric layer includes a second through-hole disposed between the variable resistance layer and the second conductive lines; at least one of a first contact or a second contact, wherein the first contact is structured to include a conductive material filled with the first through-hole and includes a first contact portion and a second contact portion spaced apart from each other, and the second contact is structured to include a conductive material filled with the second through-hole, and includes a third contact portion and a fourth contact portion spaced apart from each other, and at least one of a first doped selector layer or a second doped selector layer, wherein the first doped selector layer includes a first selection element portion interposed between the first contact portion and the second contact portion and a second selection element portion disposed in the first dielectric layer to be spaced apart from an upper surface of the first dielectric layer and a lower surface of the first dielectric layer, and the second doped selector layer includes a third selection element portion interposed between the third contact portion and the fourth contact portion and a fourth selection element portion disposed in the second dielectric layer to be spaced apart from an upper surface of the second dielectric layer and a lower surface of the second dielectric layer.

In another aspect, a method for fabricating a semiconductor device may include: forming a first conductive line over a substrate; forming a variable resistance layer over the first conductive line; forming a second conductive line over the variable resistance layer; forming a first dielectric layer including a through-hole between the first line and the variable resistance layer, between the variable resistance layer and the second conductive line, or both between the first line and the variable resistance layer and between the variable resistance layer and the second conductive line; forming a contact in the through-hole; performing a first ion implantation process to form a first sub dielectric layer within the contact and a second sub dielectric layer within the first dielectric layer such that the first sub dielectric layer is spaced apart from an upper surface and a lower surface of the contact and the second sub dielectric layer is spaced apart from an upper surface and a lower surface of the first dielectric layer by converting a portion of the contact into the first sub dielectric layer and a portion of the first dielectric layer into the second sub dielectric layer; and performing a second ion implantation of a dopant into the first sub dielectric layer and the second sub dielectric layer to form a doped selector layer, wherein the doped selector layer includes a first portion including the first sub dielectric layer and the dopant and a second portion including the second sub dielectric layer and the dopant.

DETAILED DESCRIPTION

Hereinafter, various embodiments of the disclosure will be described in detail with reference to the accompanying drawings.

Figure 1A:
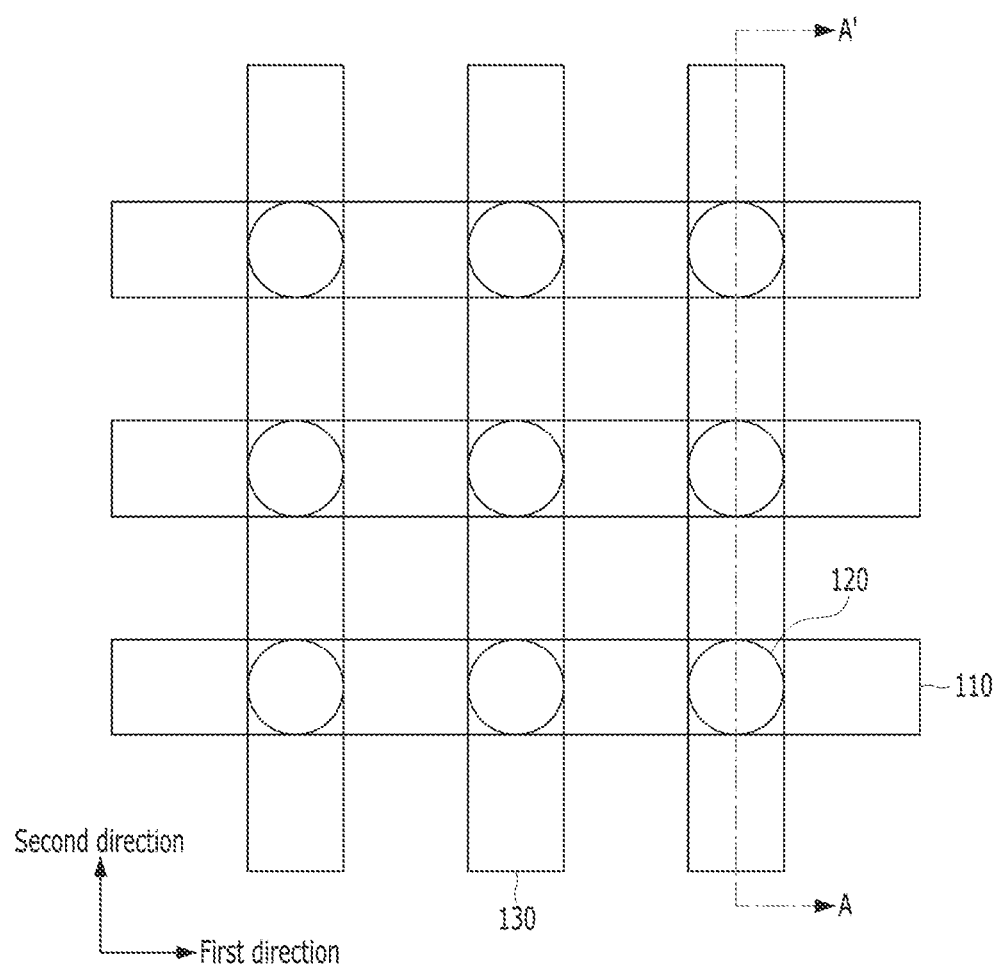
FIGS. 1A and 1B illustrate a semiconductor device based on some implementations of the disclosed technology.
Figure 1B:
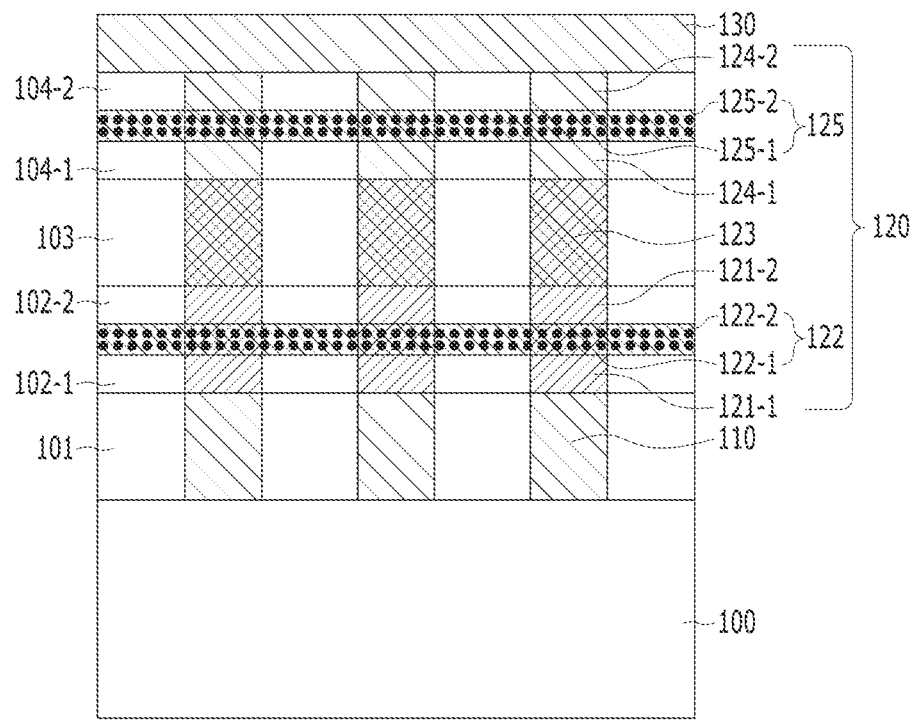

FIGS. 1A and 1B illustrate a semiconductor device based on some implementations of the disclosed technology. FIG. 1A is a plan view, and FIG. 1B is a cross-sectional view taken along line A-A' of FIG. 1A.

Referring to FIGS. 1A and 1B, the semiconductor device may include a cross-point structure including a substrate 100, first conductive lines 110 formed over the substrate 100 and extending in a first direction, second conductive lines 130 formed over the first conductive lines 110 to be spaced apart from the first conductive lines 110 and extending in a second direction crossing the first direction, and memory cells 120 disposed at intersections of the first conductive lines 110 and the second conductive lines 130 between the first conductive lines 110 and the second conductive lines 130.

The substrate 100 may include a semiconductor material such as silicon. A required lower structure (not shown) may be formed in the substrate 100. For example, the substrate 100 may include a driving circuit (not shown) electrically connected to the first conductive lines 110 and/or the second conductive lines 130 to control operations of the memory cells 120. In this patent document, the conductive lines can indicate conductive structures that electrically connect two or more circuit elements in the semiconductor device. In some implementations, the conductive lines include word lines that are used control access to memory cells in the memory device and bit lines that are used to read out information stored in the memory cells. In some implementations, the conductive lines include interconnects that carry signals between different circuit elements in the semiconductor device.

The first conductive line 110 and the second conductive line 130 may be connected to a lower end and an upper end of the memory cell 120, respectively, and may transmit a voltage or a current to the memory cell 120 to drive the memory cell 120. When the first conductive line 110 functions as a word line, the second conductive line 130 may function as a bit line. Conversely, when the first conductive line 110 functions as a bit line, the second conductive line 130 may function as a word line. The first conductive line 110 and the second conductive line 130 may include a single-layer or multilayer structure including one or more of various conductive materials. Examples of the conductive materials may include a metal, a metal nitride, or a conductive carbon material, or a combination thereof, but are not limited thereto. For example, the first conductive line 110 and the second conductive line 130 may include tungsten (W), titanium (Ti), tantalum (Ta), platinum (Pt), aluminum (Al), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), carbon (C), silicon carbide (SiC), or silicon carbon nitride (SiCN), or a combination thereof.

The memory cell 120 may be arranged in a matrix having rows and columns along the first direction and the second direction so as to overlap the intersection regions between the first conductive lines 110 and the second conductive lines 130. In an implementation, each of the memory cells 120 may have a size that is substantially equal to or smaller than that of the intersection region between each corresponding pair of the first conductive lines 110 and the second conductive lines 130. In another implementation, each of the memory cells 120 may have a size that is larger than that of the intersection region between each corresponding pair of the first conductive lines 110 and the second conductive lines 130.

Spaces between the first conductive line 110, the second conductive line 130 and the memory cell 120 may be filled with dielectric layers 101, 102-1, 102-2, 103, 104-1 and 104-2. Each of the dielectric layers 101, 102-1, 102-2, 103, 104-1 and 104-2 may include a dielectric material. Examples of the dielectric material may include an oxide, a nitride, or a combination thereof. The dielectric layers 101, 102-1, 102-2, 103, 104-1 and 104-2 may include the same material as each other or different materials from each other.

The memory cell 120 may include a stacked structure including a first lower electrode contact 121-1, a first blanket-doped selector layer 122, a second lower electrode contact 121-2, a variable resistance layer 123, a first upper electrode contact 124-1, a second blanket-doped selector layer 125 and a second upper electrode contact 124-2. Each blanket-doped layer at a region is doped uniformly within that region without using any mask or pattern within that doped region during the doping.

The first lower electrode contact 121-1 may be interposed between the first conductive lines 110 and the first blanket-doped selector layer 122. The first lower electrode contact 121-1 may be disposed at a lowermost portion of the memory cells 120 and function as a circuit node that carries a voltage or a current between a corresponding one of the first conductive lines 110 and the remaining portion of each of the memory cells 120. The second upper electrode contact 124-2 may be disposed at an uppermost portion of the memory cell 120 and function as a transmission path of a voltage or a current between the rest of the memory cell 120 and a corresponding one of the second conductive lines 130. In this patent document, the electrode contact may include contacts, contact plugs, or any other structures with a small gap that is filled with a conductive material such as metal.

The first and the second lower electrode contacts 121-1 and 121-2, and the first and the second upper electrode contacts 124-1 and 124-2 may include a material that can be used to form a dielectric material layer by using oxygen, nitrogen, or a combination of oxygen and nitrogen through, e.g., an ion implantation process. For example, the first and the second lower electrode contacts 121-1 and 121-2, and the first and the second upper electrode contacts 124-1 and 124-2 may include tungsten (W), titanium (Ti), tantalum (Ta), vanadium (V), chromium (Cr), platinum (Pt), aluminum (Al), copper (Cu), copper (Cu), zinc (Zn), nickel (Ni), cobalt (Co), lead (Pb), manganese (Mn), niobium (Nb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), or tantalum aluminum nitride (TaAlN) or a combination thereof.

The first and the second lower electrode contacts 121-1 and 121-2, and the first and the second upper electrode contacts 124-1 and 124-2 may include the same material as each other, or different materials from each other.

The first and the second lower electrode contacts 121-1 and 121-2 may have the same thickness as each other, or different thicknesses from each other.

The first and the second upper electrode contacts 124-1 and 124-2 may have the same thickness as each other, or different thicknesses from each other.

At least one of the first and the second lower electrode contacts 121-1 and 121-2, and the first and the second upper electrode contacts 124-1 and 124-2 may be omitted.

The variable resistance layer 123 may be used to store data using the different resistance states of the variable resistance layer 123 (e.g., using high and low resistance states to represent digital level "1" and "0") by setting the variable resistance layer 123 into a desired resistance state, and to change a stored data bit by switching between different resistance states, according to an applied voltage or current. The variable resistance layer 123 may have a single-layered structure or a multi-layered structure including at least one of materials used for an RRAM, a PRAM, an MRAM, an FRAM, and others. For example, the variable resistance layer 123 may include a metal oxide such as a transition metal oxide or a perovskite-based oxide, a phase change material such as a chalcogenide-based material, a ferromagnetic material, a ferroelectric material, or others. However, the implementations are not limited thereto, and the memory cell 120 may include other memory layers capable of storing data in various ways instead of the variable resistance layer 123.

In some implementations, the variable resistance layer 123 may include a magnetic tunnel junction (MTJ) structure. This will be explained with reference to FIG. 1C.

Figure 1C:
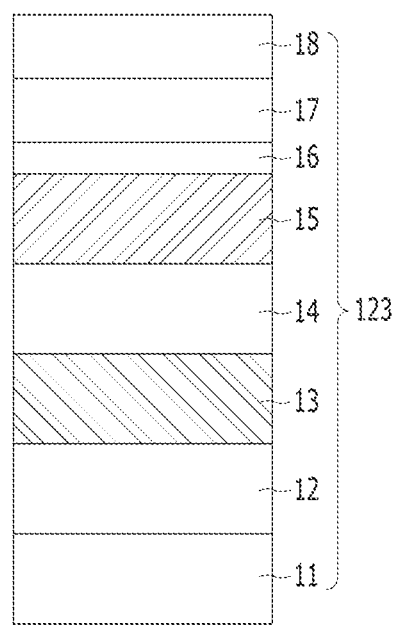
FIG. 1C illustrates an example of magnetic tunnel junction (MTJ) structure included in a variable resistance layer based on some implementations of the disclosed technology.

FIG. 1C illustrates an example of Magnetic Tunnel Junction (MTJ) structure included in the variable resistance layer 123.

The variable resistance layer 123 may include an MTJ structure including a free layer 13 having a variable magnetization direction, a pinned layer 15 having a pinned magnetization direction and a tunnel barrier layer 14 interposed between the free layer 13 and the pinned layer 15.

The free layer 13 may have one of different magnetization directions or one of different spin directions of electrons to switch the polarity of the free layer 13 in the MTJ structure, resulting in changes in resistance value. In some implementations, the polarity of the free layer 13 is changed or flipped upon application of a voltage or current signal (e.g., a driving current above a certain threshold) to the MTJ structure. With the polarity changes of the free layer 13, the free layer 13 and the pinned layer 15 have different magnetization directions or different spin directions of electron, which allows the variable resistance layer 123 to store different data or represent different data bits. The free layer 13 may also be referred as a storage layer. The magnetization direction of the free layer 13 may be substantially perpendicular to a surface of the free layer 13, the tunnel barrier layer 14 and the pinned layer 15. In other words, the magnetization direction of the free layer 13 may be substantially parallel to stacking directions of the free layer 13, the tunnel barrier layer 14 and the pinned layer 15. Therefore, the magnetization direction of the free layer 13 may be changed between a downward direction and an upward direction. The change in the magnetization direction of the free layer 13 may be induced by a spin transfer torque generated by an applied current or voltage.

The free layer 13 may have a single-layer or multilayer structure including a ferromagnetic material. For example, the free layer 13 may include an alloy based on Fe, Ni or Co, for example, an Fe—Pt alloy, an Fe—Pd alloy, a Co—Pd alloy, a Co—Pt alloy, a Co—Fe alloy, an Fe—Ni—Pt alloy, a Co—Fe—Pt alloy, a Co—Ni—Pt alloy, or a Co—Fe—B alloy, or others, or may include a stack of metals, such as Co/Pt, or Co/Pd, or others.

The tunnel barrier layer 14 may allow the tunneling of electrons in both data reading and data writing operations. In a write operation for storing new data, a high write current may be directed through the tunnel barrier layer 14 to change the magnetization direction of the free layer 13 and thus to change the resistance state of the MTJ for writing a new data bit. In a reading operation, a low reading current may be directed through the tunnel barrier layer 14 without changing the magnetization direction of the free layer 13 to measure the existing resistance state of the MTJ under the existing magnetization direction of the free layer 13 to read the stored data bit in the MTJ. The tunnel barrier layer 14 may include a dielectric oxide such as MgO, CaO, SrO, TiO, VO, or NbO or others.

The pinned layer 15 may have a pinned magnetization direction, which remains unchanged while the magnetization direction of the free layer 13 changes. The pinned layer 15 may be referred to as a reference layer. In some implementations, the magnetization direction of the pinned layer 15 may be pinned in a downward direction. In some implementations, the magnetization direction of the pinned layer 15 may be pinned in an upward direction.

The pinned layer 15 may have a single-layer or multilayer structure including a ferromagnetic material. For example, the pinned layer 15 may include an alloy based on Fe, Ni or Co, for example, an Fe—Pt alloy, an Fe—Pd alloy, a Co—Pd alloy, a Co—Pt alloy, a Co—Fe alloy, an Fe—Ni—Pt alloy, a Co—Fe—Pt alloy, a Co—Ni—Pt alloy, or a Co—Fe—B alloy, or may include a stack of metals, such as Co/Pt, or Co/Pd or others.

If a voltage or current is applied to the variable resistance layer 123, the magnetization direction of the free layer 13 may be changed by spin torque transfer. In some implementations, when the magnetization directions of the free layer 13 and the pinned layer 15 are parallel to each other, the variable resistance layer 123 may be in a low resistance state, and this may indicate digital data bit "0." Conversely, when the magnetization directions of the free layer 13 and the pinned layer 15 are anti-parallel to each other, the variable resistance layer 123 may be in a high resistance state, and this may indicate a digital data bit "1." In some implementations, the variable resistance layer 123 can be configured to store data bit '1' when the magnetization directions of the free layer 13 and the pinned layer 15 are parallel to each other and to store data bit '0' when the magnetization directions of the free layer 13 and the pinned layer 15 are anti-parallel to each other.

In some implementations, the variable resistance layer 123 may further include one or more layers performing various functions to improve a characteristic of the MTJ structure. For example, the variable resistance layer 123 may further include at least one of a buffer layer 11, an under layer 12, a spacer layer 16, a magnetic correction layer 17 and a capping layer 18.

The under layer 12 may be disposed under the free layer 13 and may be used to improve perpendicular magnetic crystalline anisotropy of the free layer 13. The under layer 12 may have a single-layer or multilayer structure including a metal, a metal alloy, a metal nitride, or a metal oxide, or a combination thereof.

The buffer layer 11 may be disposed below the under layer 12 to facilitate crystal growth of the under layer 12, thus improving perpendicular magnetic crystalline anisotropy of the free layer 13. The buffer layer 11 may have a single-layer or multilayer structure including a metal, a metal alloy, a metal nitride, or a metal oxide, or a combination thereof. Moreover, the buffer layer 11 may be formed of or include a material having a good compatibility with a bottom electrode (not shown) in order to resolve the lattice constant mismatch between the bottom electrode and the under layer 12. For example, the buffer layer 11 may include tantalum (Ta).

The spacer layer 16 may be interposed between the magnetic correction layer 17 and the pinned layer 15 and function as a buffer between the magnetic correction layer 17 and the pinned layer 15. The spacer layer 16 may be used to improve characteristics of the magnetic correction layer 17. The spacer layer 16 may include a noble metal such as ruthenium (Ru).

The magnetic correction layer 17 may be used to offset the effect of the stray magnetic field produced by the pinned layer 15. In this case, the effect of the stray magnetic field of the pinned layer 15 can decrease, and thus a biased magnetic field in the free layer 13 can decrease. The magnetic correction layer 17 may have a magnetization direction anti-parallel to the magnetization direction of the pinned layer 15. In the implementation, when the pinned layer 15 has a downward magnetization direction, the magnetic correction layer 17 may have an upward magnetization direction. Conversely, when the pinned layer 15 has an upward magnetization direction, the magnetic correction layer 17 may have a downward magnetization direction. The magnetic correction layer 17 may be exchange coupled with the pinned layer 15 via the spacer layer 16 to form a synthetic anti-ferromagnet (SAF) structure. The magnetic correction layer 17 may have a single-layer or multilayer structure including a ferromagnetic material.

In this implementation, the magnetic correction layer 17 is located above the pinned layer 15, but the magnetic correction layer 17 may disposed at a different location. For example, the magnetic correction layer 17 may be located above, below, or next to the MTJ structure while the magnetic correction layer 17 is patterned separately from the MTJ structure.

The capping layer 18 may be used to protect the variable resistance layer 123 and/or function as a hard mask for patterning the variable resistance layer 123. In some implementations, the capping layer 18 may include various conductive materials such as a metal. In some implementations, the capping layer 18 may include a metallic material having almost none or a small number of pin holes and high resistance to wet and/or dry etching. In some implementations, the capping layer 18 may include a metal, a nitride, or an oxide, or a combination thereof. For example, the capping layer 18 may include a noble metal such as ruthenium (Ru).

The capping layer 18 may have a single-layer or multilayer structure. In some implementations, the capping layer 18 may have a multilayer structure including an oxide, or a metal, or a combination thereof. For example, the capping layer 18 may have a multilayer structure of an oxide layer, a first metal layer and a second metal layer.

A material layer (not shown) for resolving the lattice structure differences and the lattice constant mismatch between the pinned layer 15 and the magnetic correction layer 17 may be interposed between the pinned layer 15 and the magnetic correction layer 17. For example, this material layer may be amorphous and may include a metal a metal nitride, or metal oxide.

The first and the second blanket-doped selector layers 122 and 125 may be used to control access to the variable resistance layer 123. To this end, the first and the second blanket-doped selector layers 122 and 125 may have a characteristic for adjusting the flow of a current according to the magnitude of the applied a voltage or a current, that is, for blocking or substantially limiting a current flowing through the memory cell 120 when a magnitude of an applied voltage is less than a predetermined threshold value and for allowing a current flowing through the memory cell 120 to abruptly increase when the magnitude of the applied voltage is equal to or greater than the threshold value. The first and the second blanket-doped selector layers 122 and 125 may include a Metal Insulator Transition (MIT) material such as $NbO_2$, $TiO_2$, $VO_2$, $WO_2$, or others, a Mixed Ion-Electron Conducting (MIEC) material such as $ZrO_2(Y_2O_3)$, $Bi_2O_3$—$BaO$, $(La_2O_3)_x(CeO_2)_{1-x}$, or others, an Ovonic Threshold Switching (OTS) material including chalcogenide material such as $Ge_2Sb_2Te_5$, $As_2Te_3$, $As_2$, $As_2Se_3$, or others, or a tunneling insulating material such as silicon oxide, silicon nitride, a metal oxide, or others. A thickness of the tunneling insulating layer is sufficiently small to allow tunneling of electrons under a given voltage or a given current. The first and the second blanket-doped selector layers 122 and 125 may include a single-layer or multilayer structure.

In one implementation, the first and the second blanket-doped selector layers 122 and 125 may be configured to perform a threshold switching operation. In this patent document, the term "threshold switching operation" can be used to indicate turning on or off the first and the second blanket-doped selector layers 122 and 125 while an external voltage is applied to the first and the second blanket-doped selector layers 122 and 125 at a voltage value with respect to a threshold voltage. The absolute value of the external voltage may be controlled to gradually increase or decrease. When the absolute value of the external voltage applied to the first and the second blanket-doped selector layers 122 and 125 increases, the first and the second blanket-doped selector layers 122 and 125 may be turned on to be electrically conductive, when the absolute value of the external voltage is greater than a first threshold voltage, once turned on, the increase of this external voltage causes an operation current to increase nonlinearly. When the absolute value of the external voltage applied to the first and the second blanket-doped selector layers 122 and 125 decreases after the first and the second blanket-doped selector layers 122 and 125 are turned on, the operation current flowing through or between the first and the second blanket-doped selector layers 122 and 125 decreases nonlinearly until the applied voltage value reaches a second threshold voltage below which the first and the second blanket-doped selector layers 122 and 125 may be turned off (i.e., electrically non-conductive). As such, the first and the second blanket-doped selector layers 122 and 125 performing the threshold switching operation may have a non-memory operation characteristic.

In some implementations, the first and the second blanket-doped selector layers 122 and 125 may include a dielectric material having incorporated dopants. The first and the second blanket-doped selector layers 122 and 125 may include an oxide with dopants, a nitride with dopants, or an oxynitride with dopants, or a combination thereof such as silicon oxide, tungsten oxide, titanium oxide, vanadium oxide, chromium oxide, platinum oxide, aluminum oxide, copper oxide, zinc oxide, nickel oxide, cobalt oxide, lead oxide, manganese oxide, niobium oxide, hafnium oxide, silicon nitride, tungsten nitride, titanium nitride, vanadium nitride, chromium nitride, platinum nitride, aluminum nitride, copper nitride, zinc nitride, nickel nitride, cobalt nitride, lead nitride, manganese nitride, niobium nitride, hafnium nitride, silicon oxynitride, tungsten oxynitride, titanium oxynitride, vanadium oxynitride, chromium oxynitride, Platinum oxynitride, aluminum oxynitride, copper oxynitride, zinc oxynitride, nickel oxynitride, cobalt oxynitride, lead oxynitride, manganese oxynitride, niobium oxynitride, or hafnium oxynitride, or a combination thereof. The dopants doped into the first and the second blanket-doped selector layers 122 and 125 may include an n-type dopant or a p-type dopant and be combined or incorporated, for example, by an ion implantation process. Examples of the dopants may include one or more of boron (B), nitrogen (N), carbon (C), phosphorous (P), arsenic (As), aluminum (Al), silicon (Si) and germanium (Ge).

Conventionally, a doped selector may be formed by depositing a dielectric layer as a matrix for the selector, combining or incorporating a dopant into the dielectric layer by an ion implantation process and patterning the doped dielectric layer. In this case, the separate dielectric layer should be formed for forming the selector, thereby increasing the overall height of the memory, which may cause insufficient hard mask margin during the subsequent patterning process. As a result, etch damage to the doped selector may occur during the patterning process.

In order to overcome such problems, in implementations of the disclosed technology, the first and the second blanket-doped selector layers 122 and 125 including a doped dielectric material may be formed by introducing oxygen and/or nitrogen into a part of a lower electrode contact and/or a part of an upper electrode contact to convert the part of the lower electrode contact and/or the part of the upper electrode contact into dielectric layers, instead of forming a separate dielectric layer for the first and the second blanket-doped selector layers 122 and 125, and then introducing or implanting a dopant into the dielectric layers by e.g., an ion implantation process.

The first and the second blanket-doped selector layers 122 and 125 may include the dielectric material and the dopant.

The first blanket-doped selector layer 122 may include a first portion 122-1 and a second portion 122-2. The first portion 122-1 may be disposed between the first lower electrode contact 121-1 and the second lower electrode contact 121-2, and the second portion 122-2 may be disposed between the dielectric layer 102-1 and the dielectric layer 102-2.

In some implementations, the first portion 122-1 and the second portion 122-2 may have different dielectric materials from each other.

The second blanket-doped selector layer 125 may include a first portion 125-1 and a second portion 125-2. The first portion 125-1 may be disposed between the first upper electrode contact 124-1 and the second upper electrode contact 124-2, and the second portion 125-2 may be disposed between the dielectric layer 104-1 and the dielectric layer 104-2.

In some implementations, the first portion 125-1 and the second portion 125-2 may have different dielectric materials from each other.

In some implementations, the first portion 122-1 of the first blanket-doped selector layer 122 and the first portion 125-1 of the second blanket-doped selector layer 125 may include the same dielectric material and dopant as each other.

In some implementations, the second portion 122-2 of the first blanket-doped selector layer 122 and the second portion 125-2 of the second blanket-doped selector layer 125 may include the same dielectric material and dopant as each other.

A distance from a lower surface of the first lower electrode contact 121-1 to a lower surface of the first portion 122-1 may be the same as or different from a distance from an upper surface of the second lower electrode contact 121-2 to an upper surface of the first portion 122-1. A distance from a lower surface of the dielectric layer 102-1 to the lower surface of the second portion 122-2 may be the same as or different from a distance from an upper surface of the dielectric layer 102-2 to the upper surface of the second portion 122-2.

A distance from a lower surface of the first upper electrode contact 124-1 to a lower surface of the first portion 125-1 may be the same as or different from a distance from an upper surface of the second upper electrode contact 125-2 to an upper surface of the second portion 125-2. A distance from a lower surface of the dielectric layer 104-1 to the lower surface of the first portion 125-1 may be the same as or different from a distance from an upper surface of the dielectric layer 104-2 to the upper surface of the second portion 125-2.

In some implementations, a separate dielectric layer for forming the first and the second blanket-doped selector layers 122 and 125 is not formed. Thus, the overall height of the memory cell 120 is not increased, thereby improving a hard mask margin and preventing etch damage during a patterning process of the first and the second blanket-doped selector layers 122 and 125.

Forming the first and the second blanket-doped selector layers 122 and 125 will be described in detail with reference to FIGS. 2A to 2G, FIGS. 3A to 3D, and FIGS. 4A to 4D.

In some implementations, the first and the second blanket-doped selector layers 122 and 125 may perform a threshold switching operation through a doped region formed in a material layer for the first and the second blanket-doped selector layers 122 and 125. Thus, a size of the threshold switching operation region may be controlled by a distribution area of the dopants. The dopants may form trap sites for charge carriers in the material layer for the first and the second blanket-doped selector layers 122 and 125. The trap sites may capture the charge carriers moving in the first and the second blanket-doped selector layers 122 and 125, based on an external voltage applied to the first and the second blanket-doped selector layers 122 and 125. The trap sites thereby provide a threshold switching characteristic and are used to perform a threshold switching operation.

In some implementations, each of the memory cell 120 may include the first lower electrode contact 121-1, the first blanket-doped selector layer 122, the second lower electrode contact 121-2, the variable resistance layer 123, the first upper electrode contact 124-1, the second blanket-doped selector layer 125 and the second upper electrode contact 124-2 which are sequentially stacked. However, the memory cells 120 may have different structures. In some implementations, at least one of the first blanket-doped selector layer 122 or the second blanket-doped selector layer 125 may be omitted. In some implementations, in addition to the layers 121 to 125 shown in FIG. 1B, the memory cells 120 may further include one or more layers (not shown) for enhancing characteristics of the memory cells 120 or improving fabricating processes.

In some implementations, neighboring memory cells of the plurality of memory cells 120 may be spaced apart from each other at a predetermined interval, and trenches may be present between the plurality of memory cells 120. A trench between neighboring memory cells 120 may have a height to width ratio (e.g., an aspect ratio) in a range from 1:1 to 40:1, from 10:1 to 40:1, from 10:1 to 20:1, from 5:1 to 10:1, from 10:1 to 15:1, from 1:1 to 25:1, from 1:1 to 30:1, from 1:1 to 35:1, or from 1:1 to 45:1.

In some implementations, the trench may have sidewalls that are substantially perpendicular to an upper surface of the substrate 100. In some implementations, neighboring trenches may be spaced apart from each other by an equal or similar distance.

In some implementations, the semiconductor device may include further layers in addition to the first conductive line 110, the memory cell 120 and the second conductive line 130.

Although one cross-point structure has been described, two or more cross-point structures may be stacked in a vertical direction perpendicular to a top surface of the substrate 100.

A method for fabricating a semiconductor device will be explained with reference to FIGS. 2A to 2G.

Figure 2A:
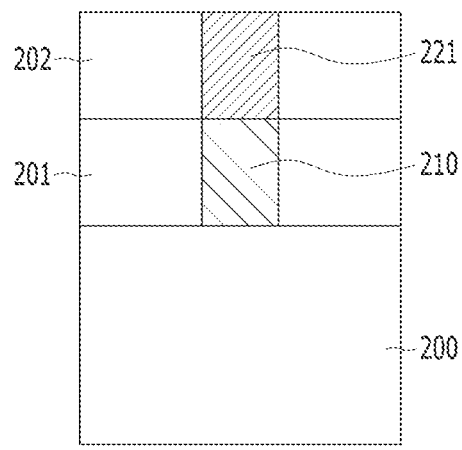
FIGS. 2A to 2G are cross-sectional views illustrating an example method for fabricating a semiconductor device based on some implementations of the disclosed technology.

Referring to FIG. 2A, first conductive lines 210 may be formed over a substrate 200 in which a predetermined structure is formed. The first conductive lines 210 may be formed by forming a first interlayer dielectric layer 201 having a trench for forming the first conductive lines 210 over the substrate 200, forming a conductive layer for the first conductive lines 210, and etching the conductive layer using a mask pattern in a line shape extending in a first direction.

A lower electrode contact 221 may be formed over the first conductive lines 210. The lower electrode layer 221 may be formed by forming a second interlayer dielectric layer 202 having a hole over the structure in which the first conductive lines 210 are formed, forming a material layer for the lower electrode layer 221 in the hole, and performing a planarization process such as a chemical mechanical planarization (CMP).

The lower electrode contact 221 may include a material capable of forming a dielectric material by combining or incorporating oxygen, nitrogen, or a combination of oxygen and nitrogen through, e.g., an ion implantation process. For example, the lower electrode contact 221 may include tungsten (W), titanium (Ti), tantalum (Ta), vanadium (V), chromium (Cr), platinum (Pt), aluminum (Al), copper (Cu), copper (Cu), zinc (Zn), nickel (Ni), cobalt (Co), lead (Pb), manganese (Mn), niobium (Nb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), or tantalum aluminum nitride (TaAlN), or a combination thereof.

Figure 2B:
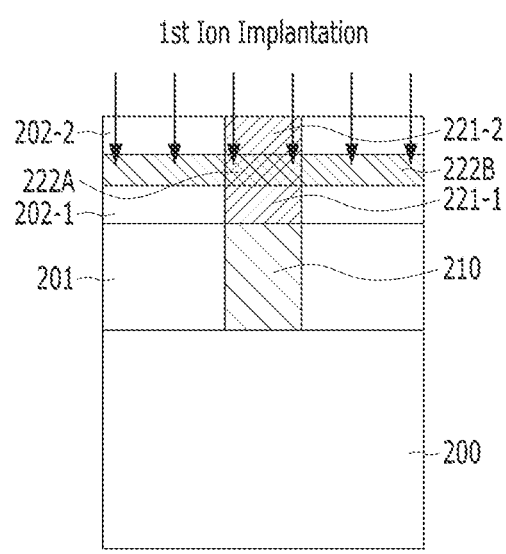

Referring to FIG. 2B, a first ion implantation process may be performed on a portion of the lower electrode contact 221 and a portion of the second interlayer dielectric layer 202 to incorporate oxygen, nitrogen, or a combination thereof into the portion of the lower electrode contact 221 and the portion of the second interlayer dielectric layer 202. The portion of the lower electrode contact 221 may be a portion spaced apart from an upper surface and a lower surface of the lower electrode contact 221. Similarly, the portion of the second interlayer dielectric layer 202 may be a portion spaced apart from an upper surface and a lower surface of the second interlayer dielectric layer 202. That is, the first ion implantation process may be performed by targeting the position spaced apart from the upper surface and the lower surface of the lower electrode contact 221 and the position spaced apart from the upper surface and the lower surface of the second interlayer dielectric layer 202 so as to incorporate oxygen, nitrogen, or a combination thereof into a given part of the lower electrode contact 221 and a given part of the second interlayer dielectric layer 202 in a direction perpendicular to the surfaces of the layers. The first ion implantation process may be a process to convert the portions of the lower electrode contact 221 and the second interlayer dielectric layer 202 into dielectric layers by oxidizing, nitriding, or oxynitriding. Since the second interlayer dielectric layer 202 is originally formed of a dielectric material, it may maintain dielectric characteristics even after oxygen and/or nitrogen is introduced by the first ion implantation process.

In the first ion implantation process, a projection range (Rp) may be adjusted in consideration of a position and a thickness of a first blanket-doped selector layer (see, reference numeral 222 of FIG. 2C) formed in a subsequent process.

By the first ion implantation process, a first material layer 222A may be formed in the lower electrode contact 221, and a second material layer 222B may be formed in the second interlayer dielectric layer 202. The lower electrode contact 221 below the first material layer 222A and the lower electrode contact 221 over the first material layer 222A may be referred to as a first lower electrode contact 221-1 and a second lower electrode contact 221-2, respectively. The first lower electrode contact 221-1 and the second lower electrode contact 221-2 may have the same thickness as each other, or different thicknesses from each other. The second interlayer dielectric layer 202 below the second material layer 222B and the second interlayer dielectric layer 202 over the second material layer 222B may be referred to as a first portion 202-1 of the second interlayer dielectric layer 202 and a second portion 202-2 of the second interlayer dielectric layer 202, respectively. The first portion 202-1 and the second portion 202-2 may have the same thickness as each other, or different thicknesses from each other.

Each of the first material layer 222A and the second material layer 222B may include a dielectric material. In some implementations, the first material layer 222A and the second material layer 222B may include different dielectric materials from each other.

Figure 2C:
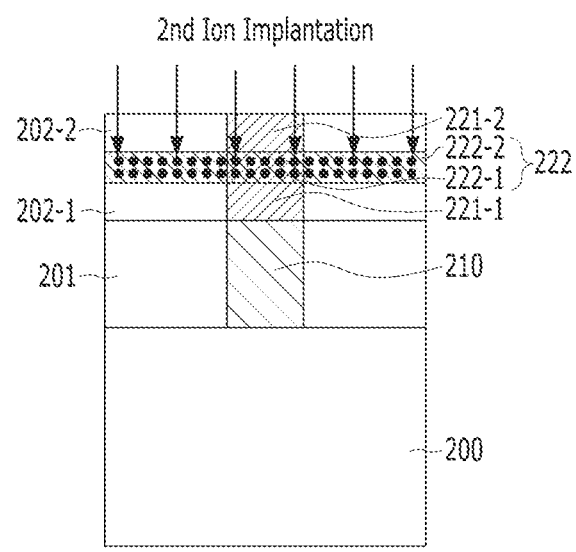

Referring to FIG. 2C, the first blanket-doped selector layer 222 may be formed by incorporating a dopant through performing a second ion implantation process on the first material layer 222A and the second material layer 222B.

The first blanket-doped selector layer 222 may include a first portion 222-1 interposed between the first lower electrode contact 221-1 and the second lower electrode contact 221-2, and a second portion 222-2 interposed between the first portion 202-1 and the second portion 202-2 of the second interlayer dielectric layer 202. That is, the first blanket-doped selector layer 222 may be interposed in a form of a blanket-doped between the first lower electrode contact 221-1 and the second lower electrode contact 221-2, and between the first portion 202-1 and the second portion 202-2 of the second interlayer dielectric layer 202

The dopant doped by the second ion implantation process may include one or more of boron (B), nitrogen (N), carbon (C), phosphorous (P), arsenic (As), aluminum (Al), silicon (Si) and germanium (Ge).

The first blanket-doped selector layer 222 may be interposed in a form of a blanket-doped between the first portion 202-1 and the second portion 202-2 of the second interlayer dielectric layer 202, and between the first lower electrode contact 221-1 and the second lower electrode contact 221-2.

Figure 2D:
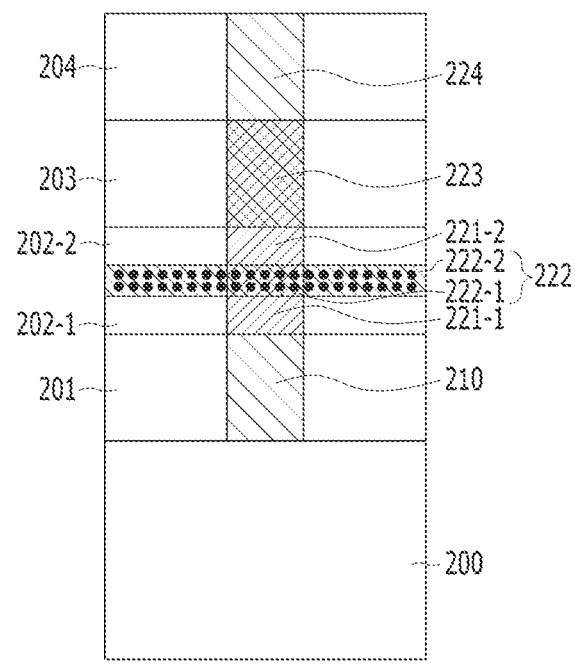

Referring to FIG. 2D, a variable resistance layer 223 and an upper electrode contact 224 may be formed over the second lower electrode contact 221-2.

The variable resistance layer 223 may be formed by forming material layers for the variable resistance layer 223 on the structure of FIG. 2C and patterning the material layers. Then, a third interlayer dielectric layer 203 may be formed.

The upper electrode contact 224 may be formed by forming a fourth interlayer dielectric layer 204 having a hole over the variable resistance layer 223 and the third interlayer dielectric layer 203, forming a material layer for the upper electrode contact 224 in the hole and performing a planarization process such as a chemical mechanical planarization (CMP).

The upper electrode contact 224 may include a material capable of forming a dielectric material by incorporating oxygen, nitrogen, or a combination thereof through e.g., an ion implantation process. For example, the upper electrode contact 224 may include tungsten (W), titanium (Ti), tantalum (Ta), vanadium (V), chromium (Cr), platinum (Pt), aluminum (Al), copper (Cu), copper (Cu), zinc (Zn), nickel (Ni), cobalt (Co), lead (Pb), manganese (Mn), niobium (Nb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), or tantalum aluminum nitride (TaAlN), or a combination thereof.

Figure 2E:
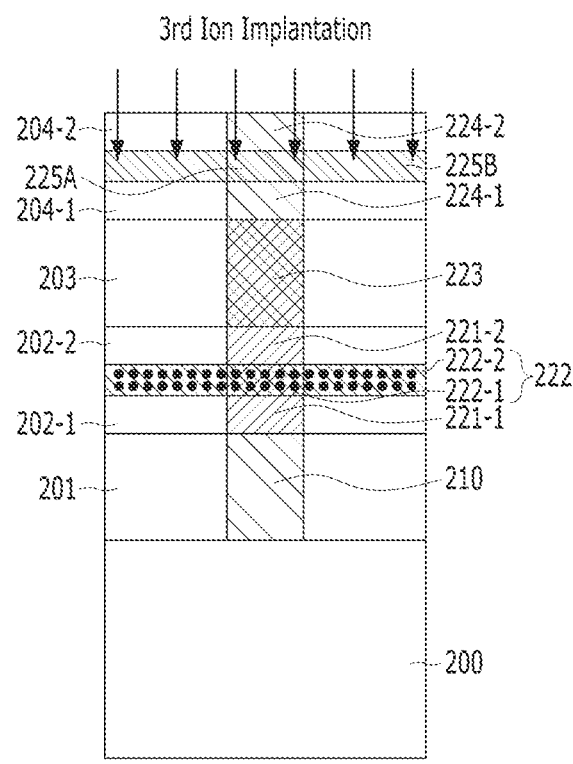

Referring to FIG. 2E, a third ion implantation process may be performed on a portion of the upper electrode contact 24 and a portion of the fourth interlayer dielectric layer 204 to incorporate oxygen, nitrogen, or a combination thereof into the portion of the upper electrode contact 224 and the portion of the fourth interlayer dielectric layer 204. The portion of the upper electrode contact 224 may be a portion spaced apart from an upper surface and a lower surface of the upper electrode contact 224. Similarly, the portion of the fourth interlayer dielectric layer 204 may be a portion spaced apart from an upper surface and a lower surface of the fourth interlayer dielectric layer 204. That is, the third ion implantation process may be performed by targeting the position spaced apart from the upper surface and the lower surface of the upper electrode contact 224 and the position spaced apart from the upper surface and the lower surface of the fourth interlayer dielectric layer 204 so as to incorporate oxygen, nitrogen, or a combination thereof into a given part of the lower electrode contact 221 and a given part of the fourth interlayer dielectric layer 204 in a direction perpendicular to the surfaces of the layers. The third ion implantation process may be a process to convert the portions of the upper electrode contact 224 and the fourth interlayer dielectric layer 204 into dielectric layers by oxidizing, nitriding, or oxynitriding. Since the fourth interlayer dielectric layer 204 is originally formed of a dielectric material, it may maintain dielectric characteristics even after oxygen and/or nitrogen is introduced by the third ion implantation process.

Figure 2F:
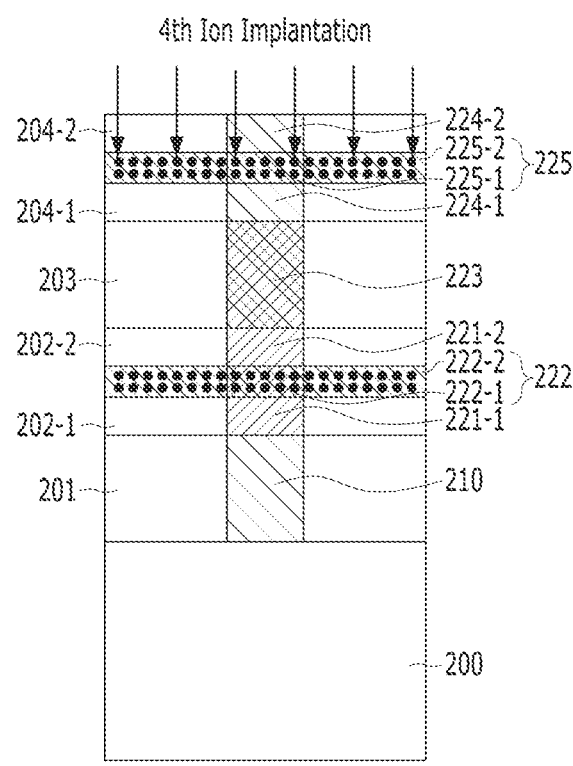

In the third ion implantation process, a projection range (Rp) may be adjusted in consideration of a position and a thickness of a second blanket-doped selector layer (e.g., 225 of FIG. 2F).

By the third ion implantation process, a first material layer 225A may be formed in the upper electrode contact 224, and a second material layer 225B may be formed in the fourth interlayer dielectric layer 204. The upper electrode contact 224 below the first material layer 225A and the upper electrode contact 224 over the first material layer 225A may be referred to as a first upper electrode contact 224-1 and a second upper electrode contact 224-2, respectively. The first upper electrode contact 224-1 and the second upper electrode contact 224-2 may have the same thickness as each other, or different thicknesses from each other. The fourth interlayer dielectric layer 204 below the second material layer 225B and the fourth interlayer dielectric layer 204 over the second material layer 225B may be referred to as a first portion 204-1 of the fourth interlayer dielectric layer 204 and a second portion 204-2 of the fourth interlayer dielectric layer 204. The first portion 204-1 and the second portion 204-2 may have the same thickness as each other, or different thicknesses from each other.

Each of the first material layer 225A and the second material layer 225B may include a dielectric material. In some implementations, the first material layer 225A and the second material layer 225B may include different dielectric materials from each other.

Referring to FIG. 2F, the second blanket-doped selector layer 225 may be formed by incorporating a dopant through performing a fourth ion implantation process on the first material layer 225A and the second material layer 225B.

The second blanket-doped selector layer 225 may include a first portion 225-1 interposed between the first upper electrode contact 224-1 and the second upper electrode contact 224-2, and a second portion 225-2 interposed between the first position 204-1 and the second portion 204-2 of the fourth interlayer dielectric layer 204.

The dopant doped by the fourth ion implantation process may include one or more of boron (B), nitrogen (N), carbon (C), phosphorous (P), arsenic (As), aluminum (Al), silicon (Si) and germanium (Ge).

The second blanket-doped selector layer 225 may be interposed in a form of a blanket-doped between the first portion 204-1 and the second portion 204-2, and between the first upper electrode contact 224-1 and the second upper electrode contact 224-2.

In some implementations, the first portion 225-1 of the second blanket-doped selector layer 225, and the first portion 222-1 of the first blanket-doped selector layer 222 may be formed of the same material as each other. In some implementations, the second portion 225-2 of the second blanket-doped selector layer 225, and the second portion 222-2 of the first blanket-doped selector layer 222 may be formed of the same material as each other. In this case, since the first blanket-doped selector layer 222 and the second blanket-doped selector layer 225 may have the same operation characteristic as each other, device operation conditions may be the same as each other.

Figure 2G:
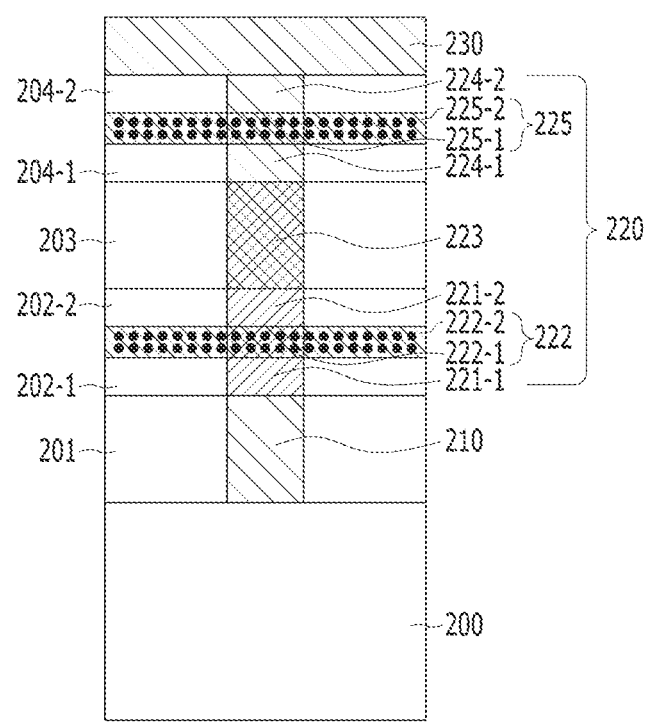

Referring to FIG. 2G, second conductive lines 230 may be formed over the second upper electrode contact 224-2 and the second portion 204-2 of the fourth interlayer dielectric layer 204.

The second conductive lines 230 may be formed by forming a conductive layer for the second conductive lines 230 over the second upper electrode contact 224-2 and the second portion 204-2 and etching the conductive layer by using a mask pattern in a line shape extending in a second direction.

Through the processes as described above, the semiconductor device including the first conductive lines 210, the memory cell 220 and the second conductive lines 230 may be formed. The memory cell 220 may include the first lower electrode contact 221-1, the first blanket-doped selector layer 222, the second lower electrode contact 221-2, the variable resistance layer 223, the first upper electrode contact 224-1 the second blanket-doped selector layer 225 and the second upper electrode contact 224-2 which are sequentially stacked.

The memory cell 220 may include the first blanket-doped selector layer 222 and the second blanket-doped selector layer 225. In some implementations, the first blanket-doped selector layer 222 and the second blanket-doped selector layer 225 may be formed of the same material as each other so as to have the same operation characteristic and device operation conditions. In case of having two blanket-doped selector layers 222 and 225, even if any one of the blanket-doped selector layers 222 and 225 is not operated, a bit cell operation at the corresponding address may be preserved.

According to the semiconductor device described above, the first and the second blanket-doped selector layers 222 and 225 may be formed by converting the portion of the lower electrode contact 221 and the portion of the upper electrode contact 224 into dielectric layers instead of forming an additional dielectric layer for the first and the second blanket-doped selector layers 222 and 225, and then introducing the dopant into the portions. Therefore, a height of the memory cell 220 may not be increased, thereby improving a hard mask margin and preventing etch damage during a patterning process of the first and the second blanket-doped selector layers 222 and 225.

The substrate 200, the first conductive lines 210, the first lower electrode contact 221-1, the first blanket-doped selector layer 222, the second lower electrode contact 221-2, the variable resistance layer 223, the first upper electrode contact 224-1, the second blanket-doped selector layer 225, the second upper electrode contact 224-2 and the second conductive lines 230 shown in FIG. 2G may correspond to the substrate 100, the first conductive lines 110, the first lower electrode contact 121-1, the first blanket-doped selector layer 122, the second lower electrode contact 121-2, the variable resistance layer 123, the first upper electrode contact 124-1, the second blanket-doped selector layer 125, the second upper electrode contact 124-2 and the second conductive lines 130.

In some implementations, the semiconductor device may include a first conductive line structured to electrically connect two or more circuit elements in the semiconductor device, a second conductive line structured to electrically connect two or more circuit elements in the semiconductor device and disposed over the first conductive line to be spaced apart from the first conductive line, a variable resistance layer disposed over the first conductive line and below the second conductive line, at least one of a first dielectric layer including a first through-hole disposed between the first conductive line and the variable resistance layer and a second dielectric layer including a second through-hole disposed between the variable resistance layer and the second conductive lines, at least one of a first contact structured to include a conductive material filled with the first through-hole and a second contact structured to include a conductive material filled with the second through-hole, the first contact including a first contact portion and a second contact portion spaced apart from each other and the second contact including a third contact portion and a fourth contact portion spaced apart from each other, and at least one of a first blanket-doped selector layer and a second blanket-doped selector layer. The first blanket-doped selector layer may include a first selection element portion interposed between the first contact portion and the second contact portion and a second selection element portion disposed in the first dielectric layer to be spaced apart from an upper surface of the first dielectric layer and a lower surface of the first dielectric layer, and the second blanket-doped selector layer may include a third selection element portion interposed between the third contact portion and the fourth contact portion and a fourth selection element portion disposed in the second dielectric layer to be spaced apart from an upper surface of the second dielectric layer and a lower surface of the second dielectric layer. Here, the first dielectric layer may include the second interlayer dielectric layer 202, and the second dielectric layer may include the fourth interlayer dielectric layer 204.

The semiconductor device described above may include both the first blanket-doped selector layer 222 and the second blanket-doped selector layer 225. However, the semiconductor device may include any one of the first blanket-doped selector layer 222 and the second blanket-doped selector layer 225. This will be described in detail with reference to FIGS. 3A to 3D and FIGS. 4A to 3D.

FIGS. 3A to 3D are cross-sectional views illustrating another example method for fabricating a semiconductor device based on some implementations of the disclosed technology.

Figure 3A:
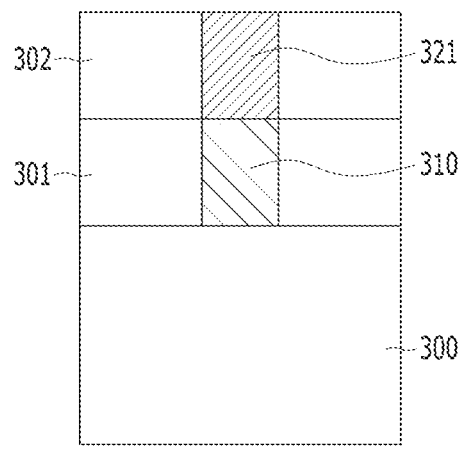
FIGS. 3A to 3D are cross-sectional views illustrating another example method for fabricating a semiconductor device based on some implementations of the disclosed technology.
Figure 3B:
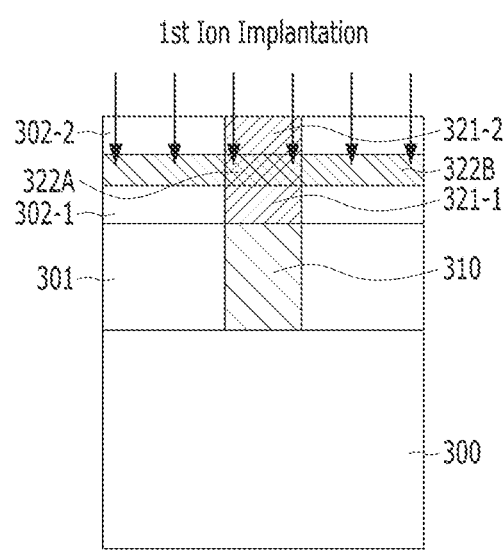
Figure 3C:
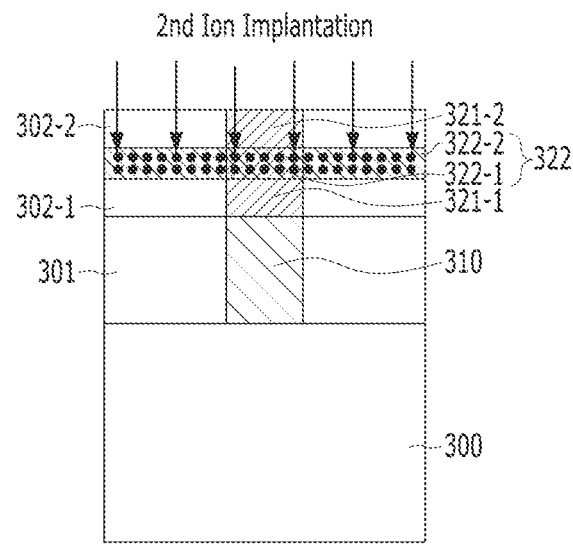

The semiconductor device illustrated in FIGS. 3A to 3D is similar to the semiconductor device illustrated in FIGS. 2A to 2G except for including only one blanket-doped selector layer (see, reference numeral 322 of FIG. 3C). The implementations illustrated in FIGS. 3A to 3D will be described focusing on differences from the above-described implementations illustrated in FIGS. 2A to 2G.

Referring to FIG. 3A, first conductive lines 310, a first interlayer dielectric layer 301, a lower electrode contact 321 and a second interlayer dielectric layer 302 may be formed over a substrate 300 in which a predetermined structure is formed.

Referring to FIG. 3B, a first ion implantation process may be performed on a portion spaced apart from an upper surface and a lower surface of the lower electrode contact 321 and a portion spaced apart from an upper surface and a lower surface of the second interlayer dielectric layer 302 to incorporate oxygen, nitrogen, or a combination thereof into the portion of the lower electrode contact 321 and the portion of the second interlayer dielectric layer 302. The first ion implantation process may be a process to convert the portions of the lower electrode contact 321 and the second interlayer dielectric layer 302 into dielectric layers by oxidizing, nitriding, or oxynitriding. Since the second interlayer dielectric layer 302 is originally formed of a dielectric material, it may maintain dielectric characteristics even after oxygen and/or nitrogen is introduced by the first ion implantation process.

In the first ion implantation process, a projection range (Rp) may be adjusted in consideration of a position and a thickness of a blanket-doped selector layer (see, reference numeral 322 of FIG. 3C) formed in a subsequent process.

By the first ion implantation process, a first material layer 322A may be formed in the lower electrode contact 321, and a second material layer 322B may be formed in the second interlayer dielectric layer 302. The first material layer 322A and the second material layer 322B may include a dielectric material. In some implementations, the first material layer 322A and the second material layer 322B may include different dielectric materials from each other. The lower electrode contact 321 below the first material layer 322A and the lower electrode contact 321 over the first material layer 322A may be referred to as a first lower electrode contact 321-1 and a second lower electrode contact 321-2, respectively. The first lower electrode contact 321-1 and the second lower electrode contact 321-2 may have the same thickness as each other, or different thicknesses from each other. The second interlayer dielectric layer 302 below the second material layer 322B and the second interlayer dielectric layer 302 over the second material layer 322B may be referred to as a first portion 302-1 of the second interlayer dielectric layer 302 and a second portion 302-2 of the second interlayer dielectric layer 302, respectively. The first portion 302-1 and the second portion 302-2 may have the same thickness as each other, or different thicknesses from each other.

Referring to FIG. 3C, the blanket-doped selector layer 322 may be formed by incorporating a dopant through performing a second ion implantation process on the first material layer 322A and the second material layer 322B through performing a second ion implantation process.

The blanket-doped selector layer 322 may include a first portion 322-1 interposed between the first lower electrode contact 321-1 and the second lower electrode contact 321-2, and a second portion 322-2 interposed between the first portion 302-1 and the second portion 302-2 of the second interlayer dielectric layer 302. That is, the blanket-doped selector layer 322 may be interposed in a form of a blanket-doped between the first lower electrode contact 321-1 and the second lower electrode contact 321-2, and between the first portion 302-1 and the second portion 302-2 of the second interlayer dielectric layer 302

Figure 3D:
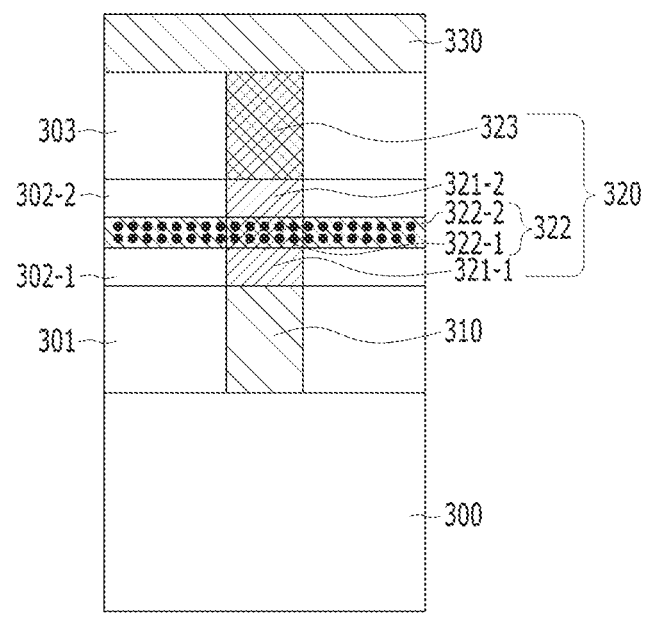

Referring to FIG. 3D, a variable resistance layer 323 may be formed over the second lower electrode contact 321-2. The variable resistance layer 323 may be formed by forming material layers for the variable resistance layer 323 on the structure of FIG. 3C and patterning the material layers. Consequently, a memory cell 320 including the first lower contact 321-1, the blanket-doped selector layer 322, the second lower contact 321-2 and the variable resistance layer 323 may be formed. Then, a third interlayer dielectric layer 303 may be formed.

Then, second conductive lines 330 may be formed over the variable resistance layer 323 and the third interlayer dielectric layer 303.

The second conductive lines 330 may be formed by forming a conductive layer for the second conductive lines 230 over the variable resistance layer 323 and the third interlayer dielectric layer 303 and etching the conductive layer by using a mask pattern in a line shape extending in a second direction.

Through the processes as described above, the semiconductor device including the first conductive lines 310, the memory cell 320 and the second conductive lines 330 may be formed. The memory cell 320 may include the first lower electrode contact 321-1, the blanket-doped selector layer 322, the second lower electrode contact 321-2 and the variable resistance layer 323 which are sequentially stacked.

The substrate 300, the first conductive lines 310, the first lower electrode contact 321-1, the blanket-doped selector layer 322, the second lower electrode contact 321-2, the variable resistance layer 323 and the second conductive lines 330 shown in FIG. 3D may correspond to the substrate 100, the first conductive lines 110, the first lower electrode contact 121-1, the first blanket-doped selector layer 122, the second lower electrode contact 121-2, the variable resistance layer 123 and the second conductive lines 130 shown in FIG. 1B, respectively, and the substrate 200, the first conductive lines 210, the first lower electrode contact 221-1, the blanket-doped selector layer 222, the second lower electrode contact 221-2, the variable resistance layer 223 and the second conductive lines 230 shown in FIG. 2G, respectively.

FIGS. 4A to 4D are cross-sectional views illustrating further another example method for fabricating a semiconductor device based on some implementations of the disclosed technology.

Figure 4A:
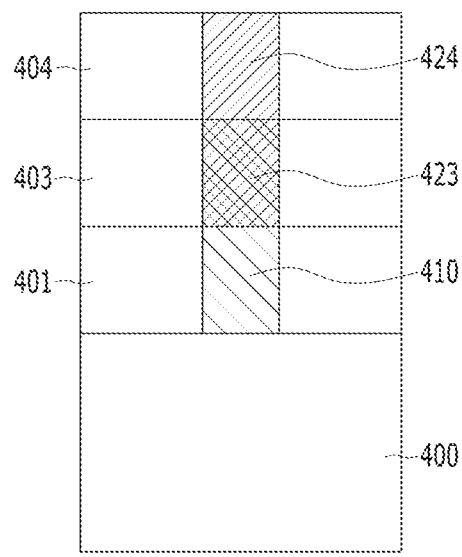
FIGS. 4A to 4D are cross-sectional views illustrating further another example method for fabricating a semiconductor device based on some implementations of the disclosed technology.
Figure 4B:
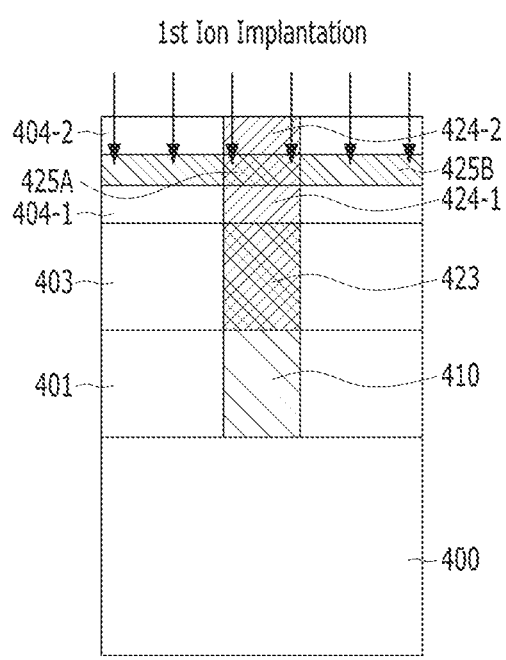
Figure 4C:
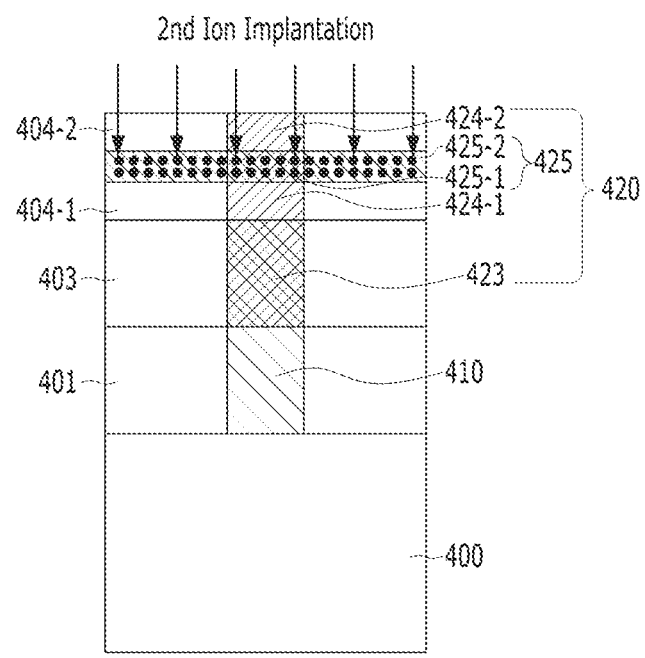

The semiconductor device illustrated in FIGS. 4A to 4D is similar to the semiconductor device illustrated in FIGS. 2A to 2G except for including only one blanket-doped selector layer (see, reference numeral 425 of FIG. 4C). The implementations illustrated in FIGS. 4A to 4D will be described focusing on differences from the above-described implementations illustrated in FIGS. 2A to 2G.

Referring to FIG. 4A, first conductive lines 410, a first interlayer dielectric layer 401, a variable resistance layer 423, a second interlayer dielectric layer 403, an upper electrode contact 424 and a third interlayer dielectric layer 404 may be formed over a substrate 400 in which a predetermined structure is formed.

Referring to FIG. 4B, a first ion implantation process may be performed on a portion spaced apart from an upper surface and a lower surface of the upper electrode contact 424 and a portion spaced apart from an upper surface and a lower surface of the third interlayer dielectric layer 404 to incorporate oxygen, nitrogen, or a combination thereof into the portion of the upper electrode contact 424 and the portion of the third interlayer dielectric layer 404. The first ion implantation process may be a process to convert the portions of the upper electrode contact 424 and the third interlayer dielectric layer 404 into dielectric layers by oxidizing, nitriding, or oxynitriding. Since the third interlayer dielectric layer 404 is originally formed of a dielectric material, it may maintain dielectric characteristics even after oxygen and/or nitrogen is introduced by the first ion implantation process.

In the first ion implantation process, a projection range (Rp) may be adjusted in consideration of a position and a thickness of a first blanket-doped selector layer (see, reference numeral 425 of FIG. 4C) formed in a subsequent process.

By the first ion implantation process, a first material layer 425A may be formed in the upper electrode contact 424 and a second material layer 425B may be formed in the third interlayer dielectric layer 404. The upper electrode contact 424 below the first material layer 425A and the upper electrode contact 424 over the upper electrode contact 424 may be referred to as a first upper electrode contact 424-1 and a second upper electrode contact 424-2, respectively. The third interlayer dielectric layer 404 below the second material layer 425B and the third interlayer dielectric layer 404 over the second material layer 425B may be referred to as a first portion 404-1 of the third interlayer dielectric layer 404 and a second portion 404-2 of the third interlayer dielectric layer 404, respectively. The first material layer 425A and the second material layer 425B may include a dielectric material. In some implementations, the first material layer 425A and the second material layer 425B may include different dielectric materials from each other.

Referring to FIG. 4C, the blanket-doped selector layer 425 may be formed by incorporating a dopant through performing a second ion implantation process on the first material layer 425A and the second material layer 425B through performing a second ion implantation process.

The blanket-doped selector layer 425 may include a first portion 425-1 interposed between the first upper electrode contact 424-1 and the second upper electrode contact 424-2 and a second portion 425-2 interposed between the first portion 404-1 and the second portion 404-2 of the third interlayer dielectric layer 404. That is, the blanket-doped selector layer 425 may be interposed in a form of a blanket-doped between the first upper electrode contact 424-1 and the second upper electrode contact 424-2, and between the first portion 404-1 and the second portion 404-2 of the third interlayer dielectric layer 404.

Consequently, a memory cell 420 including the variable resistance layer 423, the first upper contact 424-1, the blanket-doped selector layer 422 and the second upper contact 424-2 may be formed.

Figure 4D:
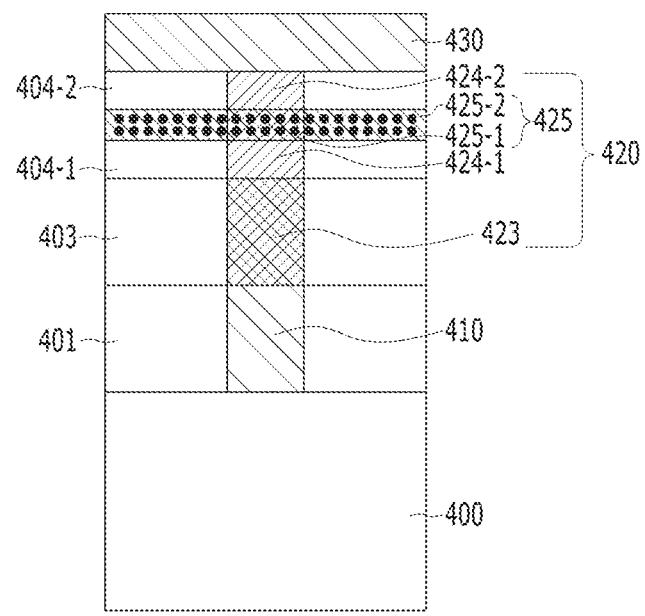

Referring to FIG. 4D, second conductive lines 330 may be formed over the second upper electrode contact 424-2 and the second portion 404-2 of the third interlayer dielectric layer 404.

Through the processes as described above, the semiconductor device including the first conductive lines 410, the memory cell 420 and the second conductive lines 430 may be formed. The memory cell 420 may include the variable resistance layer 423, the first upper contact 424-1, the blanket-doped selector layer 422 and the second upper contact 424-2 which are sequentially stacked.

The substrate 400, the first conductive lines 410, the variable resistance layer 423, the first upper electrode contact 424-1, the blanket-doped selector layer 425, the second upper electrode contact 424-2 and the second conductive lines 430 may correspond to the substrate 100, the first conductive lines 110, the first upper electrode contact 124-1, the second blanket-doped selector layer 125, second upper electrode contact 124-2 and the second conductive lines 130 shown in FIG. 1B, respectively, and the substrate 200, the first conductive lines 210, the resistance layer 223, the first upper electrode contact 224-1, the second blanket-doped selector layer 225, the second upper electrode contact 224-2 and the second conductive lines 230 shown in FIG. 2G, respectively.

While this patent document contains many specifics, these should not be construed as limitations on the scope of any disclosure or of what may be claimed, but rather as descriptions of features that may be specific to particular embodiments of particular disclosures. Certain features that are described in this patent document in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Enhancements and variations of the disclosed embodiments and other embodiments can be made based on what is described and illustrated in this patent document.

What is claimed is:

1. A semiconductor device comprising:
   a first conductive line;
   a second conductive line disposed over the first conductive line to be spaced apart from the first conductive line;
   a variable resistance layer disposed over the first conductive line and below the second conductive line;
   at least one of a first dielectric layer or a second dielectric layer, wherein the first dielectric layer includes a first through-hole disposed between the first conductive line and the variable resistance layer and the second dielectric layer includes a second through-hole disposed between the variable resistance layer and the second conductive line;
   at least one of a first contact or a second contact, wherein the first contact is structured to include a conductive material filled with the first through-hole and includes a first contact portion and a second contact portion spaced apart from each other, and the second contact is structured to include a conductive material filled with the second through-hole, and includes a third contact portion and a fourth contact portion spaced apart from each other; and
   at least one of a first doped selector layer or a second doped selector layer, wherein the first doped selector layer includes a first selection element portion interposed between the first contact portion and the second contact portion and a second selection element portion disposed in the first dielectric layer to be spaced apart from an upper surface of the first dielectric layer and a lower surface of the first dielectric layer, and the second doped selector layer includes a third selection element portion interposed between the third contact portion and the fourth contact portion and a fourth selection element portion disposed in the second dielectric layer to be spaced apart from an upper surface of the second dielectric layer and a lower surface of the second dielectric layer.

2. The semiconductor device according to claim 1, wherein each of the first and the second doped selector layers includes a dielectric material and a dopant.

3. The electronic device according to claim 2, wherein the dopant includes one or more of boron (B), nitrogen (N), carbon (C), phosphorous (P), arsenic (As), aluminum (Al), silicon (Si) and germanium (Ge).

4. The semiconductor device according to claim 1, wherein the first portion and the second portion of the first doped selector layer include different dielectric materials from each other.

5. The semiconductor device according to claim 1, wherein the third selection element portion and the fourth selection element portion of the second doped selector layer include different dielectric materials from each other.

6. The semiconductor device according to claim 1, wherein the first selection element portion and the third selection element portion include the same dielectric material and dopant as each other.

7. The semiconductor device according to claim 1, wherein the second selection element portion and the fourth selection element portion include the same dielectric material and dopant as each other.

8. The electronic device according to claim 1, wherein the first contact, the second contact, the first selection element portion and the third selection element portion include tungsten (W), titanium (Ti), tantalum (Ta), vanadium (V), chromium (Cr), platinum (Pt), aluminum (Al), copper (Cu), copper (Cu), zinc (Zn), nickel (Ni), cobalt (Co), lead (Pb), manganese (Mn), niobium (Nb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), or tantalum aluminum nitride (TaAlN), or a combination of two or more of tungsten (W), titanium (Ti), tantalum (Ta), vanadium (V), chromium (Cr), platinum (Pt), aluminum (Al), copper (Cu), copper (Cu), zinc (Zn), nickel (Ni), cobalt (Co), lead (Pb), manganese (Mn), niobium (Nb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), or tantalum aluminum nitride (TaAlN), respectively.

9. The electronic device according to claim 1, wherein a distance from the upper surfaces of the first dielectric layer and the first contact to an upper surface of the first doped selector layer and a distance from the lower surfaces of the first dielectric layer and the first contact to a lower surface of the first doped selector layer are the same as each other, or different from each other.

10. The electronic device according to claim 1, wherein a distance from the upper surfaces of the second dielectric layer and the second contact to an upper surface of the second doped selector layer and a distance from the lower surfaces of the second dielectric layer and the second contact to a lower surface of the second doped selector layer are the same as each other, or different from each other.

11. A method for fabricating a semiconductor device comprising:
forming a first conductive line over a substrate;
forming a variable resistance layer over the first conductive line;
forming a second conductive line over the variable resistance layer;
forming a first dielectric layer including a through-hole between the first line and the variable resistance layer, between the variable resistance layer and the second conductive line, or both between the first line and the variable resistance layer and between the variable resistance layer and the second conductive line;
forming a contact in the through-hole;
performing a first ion implantation process to form a first sub dielectric layer within the contact and a second sub dielectric layer within the first dielectric layer such that the first sub dielectric layer is spaced apart from an upper surface and a lower surface of the contact and the second sub dielectric layer is spaced apart from an upper surface and a lower surface of the first dielectric layer by converting a portion of the contact into the first sub dielectric layer and a portion of the first dielectric layer into the second sub dielectric layer; and
performing a second ion implantation of a dopant into the first sub dielectric layer and the second sub dielectric layer to form a doped selector layer,
wherein the doped selector layer includes a first portion including the first sub dielectric layer and the dopant and a second portion including the second sub dielectric layer and the dopant.

12. The method according to claim 11, wherein the contact includes a material capable of forming a dielectric material by using oxygen, nitrogen, or a combination of oxygen and nitrogen through the first ion implantation process.

13. The method according to claim 11, wherein the dopant doped by the second ion implantation process includes one or more of boron (B), nitrogen (N), carbon (C), phosphorous (P), arsenic (As), aluminum (Al), silicon (Si) and germanium (Ge).

14. The method according to claim 11, wherein the doped selector layer includes a dielectric material and the dopant.

15. The method according to claim 11, wherein the first sub dielectric layer and the second sub dielectric layer include different dielectric materials from each other.

16. The method according to claim 11, wherein the first dielectric layer and the second sub dielectric layer include the same dielectric material as each other, or different dielectric materials from each other.

17. The method according to claim 11, wherein the doped selector layer includes a first doped selector layer formed between the first conductive line and the variable resistance layer and a second doped selector layer formed between the variable resistance layer and the second conductive line, and
the first portion of the first doped selector layer and the first portion of the second doped selector layer include the same material as each other, and the second portion of the first doped selector layer and the second portion of the second doped selector layer include the same material as each other.

18. The method according to claim 11, wherein the contact and the first portion of the doped selector layer include tungsten (W), titanium (Ti), tantalum (Ta), vanadium (V), chromium (Cr), platinum (Pt), aluminum (Al), copper (Cu), copper (Cu), zinc (Zn), nickel (Ni), cobalt (Co), lead (Pb), manganese (Mn), niobium (Nb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), or tantalum aluminum nitride (TaAlN), or a combination of two or more of tungsten (W), titanium (Ti), tantalum (Ta), vanadium (V), chromium (Cr), platinum (Pt), aluminum (Al), copper (Cu), copper (Cu), zinc (Zn), nickel (Ni), cobalt (Co), lead (Pb), manganese (Mn), niobium (Nb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), or tantalum aluminum nitride (TaAlN).

19. The method according to claim 11, wherein a distance from upper surfaces of the first dielectric layer and the contact to an upper surface of the doped selector layer and a distance from lower surfaces of the first dielectric layer and the contact to a lower surface of the doped selector layer are the same as each other, or different from each other.

* * * * *